United States Patent [19]

Ficnh

[11] Patent Number: 5,085,410
[45] Date of Patent: Feb. 4, 1992

[54] MODULAR PROCESSING SYSTEM

[75] Inventor: Lester M. Ficnh, Idaho Falls, Id.

[73] Assignee: Jersey Nuclear-Avco Isotopes, Inc., Florham Park, N.J.

[21] Appl. No.: 450,816

[22] Filed: Dec. 14, 1989

[51] Int. Cl.⁵ .............................................. B01D 5/00
[52] U.S. Cl. ..................................... 266/44; 266/205; 204/157.22; 250/281
[58] Field of Search ................. 266/205, 228, 200, 44; 204/157.22; 250/281, 289; 414/217

[56] References Cited

U.S. PATENT DOCUMENTS

| | | | |
|---|---|---|---|
| 666,123 | 1/1901 | Wellman et al. | 266/205 |
| 777,450 | 12/1904 | Taylor | 266/205 |
| 966,986 | 8/1910 | Barnett et al. | 266/228 |
| 980,004 | 12/1910 | Reeder | 266/228 |
| 1,021,710 | 3/1912 | Stauft | 266/228 |
| 1,396,316 | 11/1921 | Bogdanffy | 266/205 |
| 1,814,927 | 7/1931 | Hock | 159/23 |
| 2,376,875 | 5/1945 | Honig | 227/8 |
| 2,388,917 | 11/1945 | Hormel | 99/199 |
| 2,656,885 | 10/1953 | Hughes | 159/11 |
| 2,667,342 | 1/1954 | Ellerbeck | 263/29 |
| 3,260,381 | 7/1966 | Wagner et al. | 214/17 |
| 3,340,146 | 9/1967 | Werner | 167/55 |
| 3,418,213 | 12/1968 | Williamson | 202/173 |
| 3,471,373 | 10/1969 | Pottharst, Jr. | 202/181 |
| 3,489,298 | 1/1970 | Samsel et al. | 214/17 |
| 3,700,132 | 10/1972 | Waters | 214/768 |
| 3,772,519 | 11/1973 | Levy et al. | 250/41.9 G |
| 3,847,616 | 11/1974 | Kaneko et al. | 96/94 R |
| 3,913,756 | 10/1975 | Barron et al. | 214/32 |
| 4,553,069 | 11/1985 | Purser | 315/111.81 |
| 4,577,112 | 3/1986 | Conche et al. | 250/506.1 |
| 4,637,342 | 1/1987 | Kamiya et al. | 118/719 |
| 4,699,555 | 10/1987 | Guarino | 414/217 |
| 4,722,654 | 2/1988 | Norton | 414/217 |
| 4,824,309 | 4/1989 | Kakehi et al. | 414/217 |

FOREIGN PATENT DOCUMENTS

| | | |
|---|---|---|
| 10057634 | 8/1982 | European Pat. Off. |
| 1166389 | 10/1969 | United Kingdom |
| 1321861 | 7/1973 | United Kingdom |
| 1521204 | 8/1978 | United Kingdom |
| 2028161 | 3/1980 | United Kingdom |

Primary Examiner—S. Kastler
Attorney, Agent, or Firm—Weingarten, Schurgin, Gagnebin & Hayes

[57] ABSTRACT

A vaporizer and extractor apparatus for a laser isotope separation process is arranged as an assemblage of modular components in which equipment subject to maintenance is replaceable via vacuum casks while the apparatus is operational or briefly shut down without loss of vacuum. A vacuum transfer cask is provided for modular extractor substrate assemblies. The substrate assemblies are nestable and are mounted on extensible probes which permit them to be nested in the vacuum transfer cask for transport. During use the substrates extend from the cask, through a vacuum lock and are placed side by side in the vacuum chamber. A vacuum transfer cask is also provided for the vaporizer assembly which is mounted on an extensible arm which in turn positions the assembly in the chamber or retraces the vaporizer assembly from the chamber into the transfer cask, rotating it during the process in order to permit it to fit into the cask. The complete vaporizer unit consisting of a crucible, two electron beam guns, a combination thermal/vapor shield and an electrical ground plate along with the associated cooling and electrical services is suspended from the extensible arm out of the vacuum transfer cask.

30 Claims, 7 Drawing Sheets

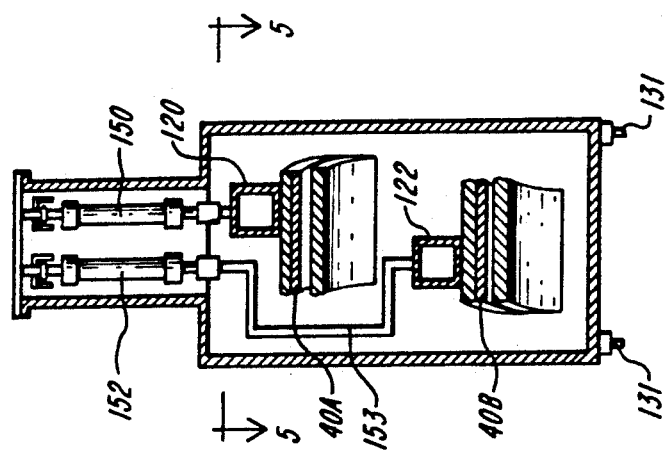
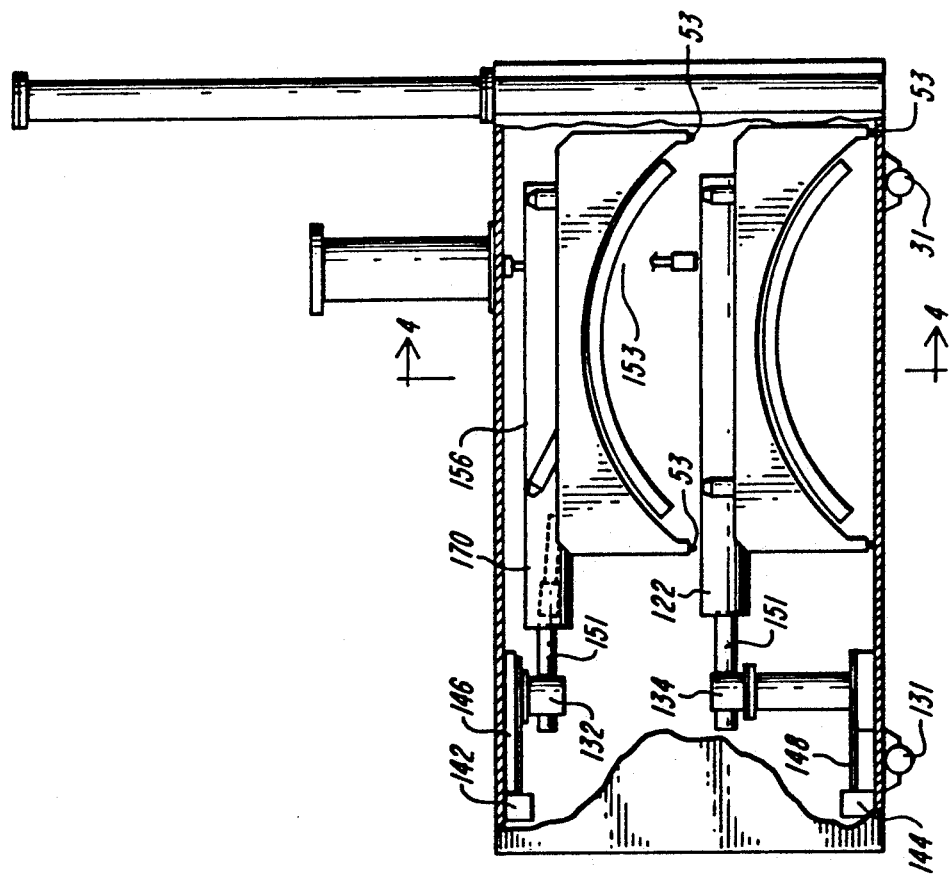
FIG. 4
FIG. 3

MODULAR PROCESSING SYSTEM

FIELD OF THE INVENTION

This invention relates generally to vacuum transfer casks, and more particularly to vacuum casks adapted for transferring modular components utilized in a vacuum process.

BACKGROUND OF THE INVENTION

Systems employing evacuated chambers have been utilized in the past for various types of processing requiring a full or partial vacuum. Vacuum type systems requiring vacuum chambers are used especially with electron microscopes, ion-micro analyzers, treatments using materials such as oil, or the fabrication of electronic components and circuits. An example of such a vacuum system is shown in U.S. Pat. No. 3,340,146. In general, these vacuum systems are utilized for controlling contamination during processing. Vacuum systems are also frequently encountered in connection with apparatus such as particle accelerators which are used for a variety of industrial processing, as well as for research purposes.

Uranium separation is another area where vacuum processing is utilized. As described in U.S. Pat. No. 3,772,519 issued Nov. 13,1973, to Richard H. Levy, et al, a method of ion separation is described in which in one embodiment, uranium U-235 is separated from U-238 by means of laser stimulation in an elongated channel to produce the requisite U-235 ionization within a vacuum chamber. This is followed by separation through the utilization of crossed magnetic and electric fields in which the ionized U-235 is directed to radially extending electrodes, while U-238 is collected at the top of the vacuum chamber.

In commercial processing it is important to be able to recover not only the collected U-235 but also the tailing which includes U-238. In order to do so, it is necessary to periodically remove both the electrode bearing structure and the tailing structure from the interior of the vacuum chamber at all points along the channel length. In existing apparatus this has been difficult to accomplish because of the size and weight of the collecting structure relative to chamber access port size, and because the removal process is preferably performed without destroying the vacuum of the chamber. This is further complicated by the substantial channel length.

In addition, it is also desirable to be able to repair or replace the vaporizer assembly without destroying the vacuum within the chamber. A movable cask for use with radioactive vacuum chambers is disclosed in U.S. Pat. No. 3,489,298. However, the cask as described therein is not suitable for removing or supporting the vaporizer assemblies or the extractor assemblies of a uranium enrichment process because of its small size and because of its lack of appropriately adapted components. The vaporizer utilized in laser isotope separation is typically a linear vaporizer of substantial length further complicating its removal from and replacement in the vacuum chamber.

SUMMARY OF THE INVENTION

The present invention contemplates axially elongate vacuum processing apparatus for isotope separation formed as a plurality of axially adjacent modular chambers. The invention includes a method and apparatus for replacing internal components of each modular chamber without system stripdown. More specifically, both vaporization and product extraction assemblies for a laser isotope separation (LIS) system are arranged as an assemblage of modular components disposed in the modular chambers. The modular chambers are aligned adjacent to one another in the axial direction of travel of a laser beam passing internally therethrough. Each modular chamber has laterally disposed valved, vacuum locks. The modular chambers together form a long axially open rectangular vacuum chamber whose length is a multiple of the module length. Each module of the vacuum chamber has an associated extractor assembly transfer cask and a vaporizer assembly transfer cask coupled to the respective vacuum locks from which numerous attachments extend through the locks into the chambers to complete the apparatus for the laser isotope separation process. This modular concept permits all components within each module to be serviced while the rest of the modules are unaffected and while the processing line is either operational or briefly shut down without loss of vacuum.

Each modular unit is provided with two transfer casks, one for the vaporizer assembly and one for the extractor assembly. These transfer casks permit the vaporizer and extractor assemblies to be removed through the valved module vacuum locks without loss of vacuum in the module.

With respect to the extractor assembly transfer cask, each extractor assembly is mounted on the end of extensible probes which project from within the transfer cask through valved vacuum locks into the modular chamber. These probes both support the assembly and serve to retract it into the cask. Desired extractor dimensions dictate that the extractor assembly have a width greater than that of the transfer cask vacuum lock width preventing extractor withdrawal directly into the cask. To permit utilization of a full size extractor geometry, the extractor assembly is divided into two portions, each of which is attached to the end of a separate extensible probe. During operation of the isotope separator, each portion is aligned in a side-by-side relationship. When it is desired to retract the extractor assembly into its respective cask, one half of the assembly is lifted and nested on top of the other half of the assembly, and the two probes holding the two assembly halves telescope into the cask.

The extractor assemblies are moved into and out of the chamber through vacuum transfer locks with all mechanical, electrical or fluid connections being supplied from the transfer cask, apart from the modular chamber itself. These connections are all provided from the transfer casks along the extensible probes. When new extractor assemblies are moved into position from another cask, the assemblies are initially nested until extended into the vacuum chamber. Once within the chamber, the upper assembly is moved laterally until it occupies a position adjacent the lower assembly then it is lowered into place onto positioning alignment rails within each chamber module.

Each complete vaporizer unit is suspended from the end of an extensible probe which projects from within a vaporizer transfer cask associated with it. The probe is adapted to provide translational motion to move the vaporizer assembly from its operational position in the vacuum chamber to a retracted position within the vaporizer transfer cask. Furthermore, the probe has means for providing a rotational motion to tilt the vaporizer unit in order to permit it to fit into the transfer cask which, of necessity, has a width less than the desired length of the vaporizer unit. The vaporizer transfer cask permits the replacement of the vaporizer unit, when necessary, and permits the full conditioning and testing of each vaporizer unit prior to on-line start up to assure that all electrical, hydraulic and mechanical functions are satisfactory. The flexible leads for coolant, hydraulics, electron beam power and instrumentation all eminated from respective sources contained within or routed through the transfer casks and the leads are carried upon power track supports during extension and retraction of the vaporizer assembly.

BRIEF DESCRIPTION OF THE DRAWING

The objects, advantages and features of this invention will be more clearly appreciated from the following detailed description taken in conjunction with the accompanying drawing in which:

FIG. 3 is an external side view, along the laser axis of an extractor assembly vacuum transfer cask showing the extractor assembly in phantom in a retracted position;

FIG. 4 is an internal, cross-sectional view taken along the line 4—4 of FIG. 3;

DETAILED DESCRIPTION OF THE PREFERRED EMBODIMENT

Figure 1:
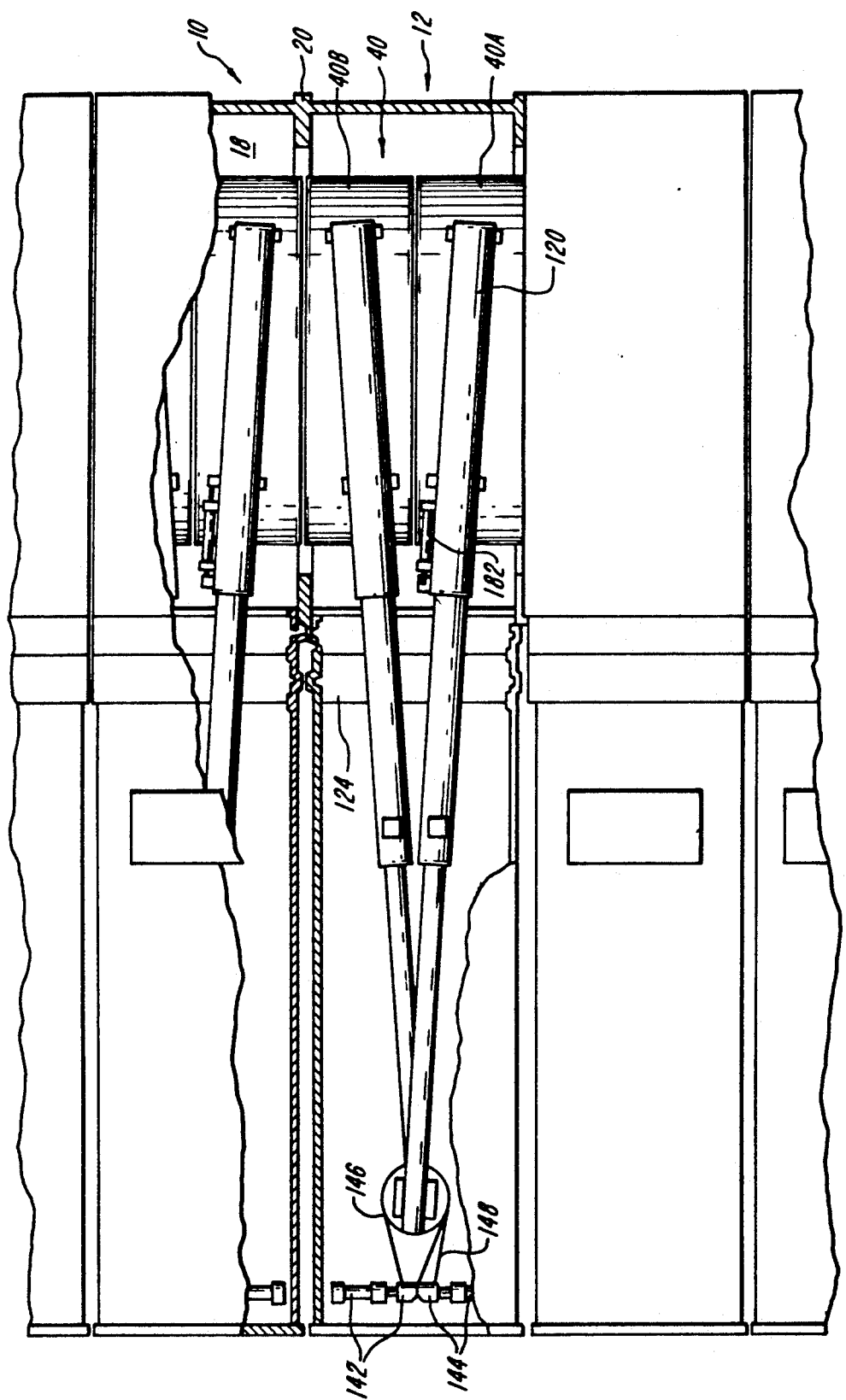
FIG. 1 is partially cut away top view of a series of exemplary modular chambers, and associated extractor assemblies of this invention.
Figure 2:
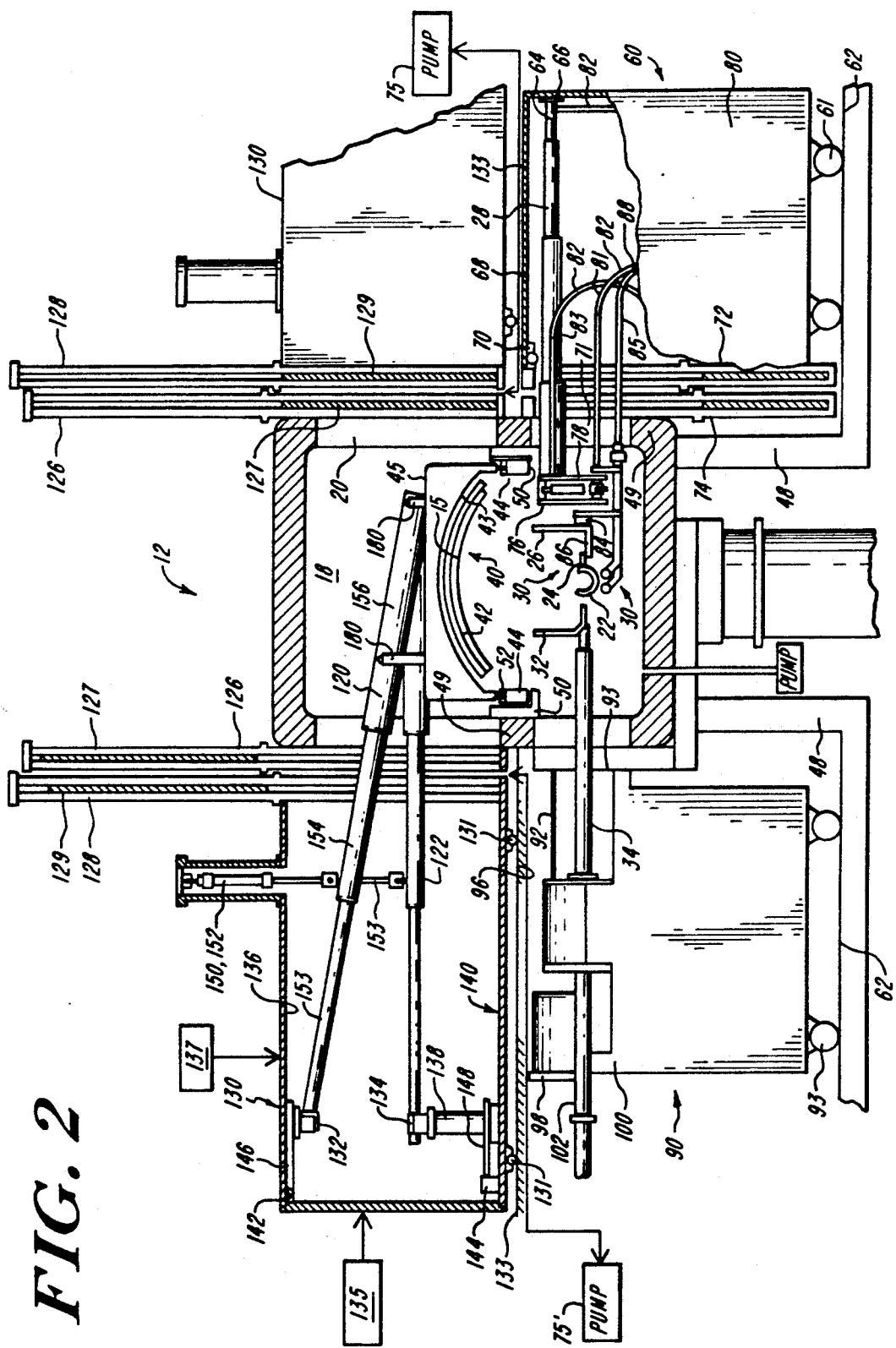
FIG. 2 is an interior view of one modular unit of this invention viewed along a laser illumination axis.

With reference now to the drawing and more particularly to FIGS. 1 and 2 thereof, there are shown partial views of a modularized vacuum chamber system for a laser isotope separation (LIS) process having a generally rectangular long vacuum tube 10 composed of sections or modules 12. The LIS process takes place within long tube 10 and can be similar in operation to that described in U.S. Pat. Nos. 3,939,354 and 3,940,615, and/or U.S. Pat. application Ser. No. 078,598 filed Sep. 19, 1979 all assigned to the assignee of the present invention. In the present invention, each module 12 has a vacuum in its interior 18. The interiors 18 of modules 12 together form the tube 10. Laser radiation may pass through the chamber 18, along an arch 15 of tube 10. In a preferred embodiment, modules 12 are approximately one meter in axial length. Modules 12 are affixed to one another at each junction thereof.

Each module 12 is supported upon a rigid, isolated foundation structure 48 (FIG. 2) providing a high degree of alignment stability for precise positioning of the laser beam along axis 15 of tube 10. Each module 12 houses within chamber a vaporizer assembly 30. These may be replaced by retraction through vacuum locks 17 at side locations of modules 12 into respective transfer casks 19 without loss of the vacuum in each chamber 18 of module 12.

During operation, vaporizer assembly 30 and an extractor assembly 40 are both disposed within the various chambers 18 of modules 12. Each vaporizer assembly 30 includes a crucible 22, a linear electron beam gun 24 and a vapor and thermal shield 26. A plurality of feeder tubes 34 extend through openings in the walls of module 12 into the vacuum chamber 18. The feeder tubes 34 are adapted to feed solid rods of uranium into the path of the electron beam to be melted into the crucible 22, replenishing the solid uranium as it is consumed, as known in the art and illustrated in U.S. Pat. No. 4,262,160. Attached to the end of the feeder tubes is another vapor and thermal shield 32.

Positioned directly above the vaporizer assembly within each chamber 18 is extractor assembly 40, as shown in FIG. 2. Extractor assembly 40 includes electrode structures 42 circling about the crucible 22 and adapted to collect ions of U-235. Arched, partial cylindrical structures 43 are placed above the electrode structures 42 for collection of non-ionized U-238 particles. Assembly 40 rests on precision rail supports 44 disposed along opposite lateral sides of each module 12, which provide the primary alignment references for the system. Rails 44 typically comprise water-cooled beams supported by flanges 50 along the walls 49 of module 12, The Walls 49 are supported by a foundation structure 48. V-blocks 52 are mounted on rail supports 44 to provide a precision alignment of assembly 40 through pins 53 (FIG. 3) mounted thereon which seat in V-blocks 52. V-blocks 52 are externally adjustable for three dimensional alignment of assembly 40, and they may be formed of a non-metallic material, such as ceramic, to permit electrical isolation of the assembly 40 from the structure of module 12 and from the vaporizer assembly 30.

With apparatus 14, and in particular tube 10, divided into modular units 12, the extractor assemblies 40 and vaporizer assemblies 30 are also modular and may be serviced or removed from each module 12 without affecting other units 12 in tube 10. Vacuum transfer casks are provided for service or replacement of each vaporizer assembly 30 or extractor assembly 40 of each unit 12. Each vaporizer assembly 30 is associated with its own transfer cask 60 and each extractor assembly is associated with its own transfer cask 130. The casks 60 and 130 are temporarily joined to the sides of each module 12 by means of respective vacuum gate valves 72, 74, 126 and 128. In this way, the vacuum of each chamber 18 is maintained during operation and during removal of extractor assemblies 40 and vaporizer assemblies 30 therefrom.

In order to obtain an optimal continuous internal processing path within tube 10, through modules 12 and interior chambers 18, it is important that the extractors and vaporizers extend edge to edge throughout tube 10. It is then impossible for the extractor assemblies 40 and the vaporizer assemblies 30 to have the same axial dimension as the vacuum locks through which they pass.

In the case of the vaporizer assembly 30, a full length vaporizer is achieved by rotating the vaporizer assembly 30 for withdrawal into its cask 60 and the process and the associated apparatus for achieving this will now be described with reference to FIGS. 2, 7, 8 and 9. Vaporizer transfer cask 60 is preferably mobile and has wheels 61 which ride on rails 62. Cask 60 is disposed externally of module 12 and may be joined therewith at vacuum port 71 by means of a transfer cask gate valve 72 which mates with another gate valve 74 on module 12, to provide a vacuum seal between the interior of cask 60 and the interior 18 of module 12. Rough pumping means 75 and associated conduit are provided for pumping between gate valves 74 and 72. A telescoping arm 28 extends through port 71 and into the interior of chamber 12. Vaporizer assembly 30 is suspended from the end of arm 28, by means of arms 76 extending downwardly from arm 28. Exterior end 64 of arm 28 is secured to back end 66 of cask 60. A support bar 70 is slidingly attached to track 68 of the interior of cask 60 and provides sliding support for arm 28 as it extends into chamber 12. An hydraulically actuated tilting mechanism 78 extends from the interior end of arm 28 to vaporizer assembly 30. Another hydraulically actuated tilting mechanism 84 is adapted to pivot vapor shield 26 towards crucible 22 over guns 24. Pivoting of shield 26 permits retraction of assembly 30 through port 71, as will be more fully described.

A power supply 80, in this illustrative embodiment is carried in lower portions of cask 60 with dedicated components for the electron beam guns 24. Power supply 80 is connected to guns 24 by means of flexible leads which extend from power supply 80 in cask 60, along power conduit 81 through port 71. In an alternative embodiment it may be preferable to locate power supply 80 outside cask 60 since the vaporizer assembly will require replenishment or repair more frequently than will the power supply 80. Hydraulic actuator hoses 82 extend from cask 60 into chamber 12 for actuation of the hydraulic cylinder of tilting mechanisms. In addition, water supply and return hoses 88 pass from cask 60 into chamber 18 through port 71 to cool crucible 22.

Disposed on the opposite side of chamber 12 from cask 60 is a mobile assembly 90 which is employed to replenish uranium to crucible 22. Assembly 90 includes a uranium feeder having feeder tubes 34 which extend through a valved vacuum lock 93 and into chamber 18 along the axial length of crucible 22. A plurality of feeder ram drives 102 are provided for each feeder tube 34. A feeder magazine system 100 supplies uranium feed rods to tube 34. One chamber 90 is associated with each module 12. Preferably assembly 90 is mobile and has wheels 95 which roll on rails 62.

Figure 7:
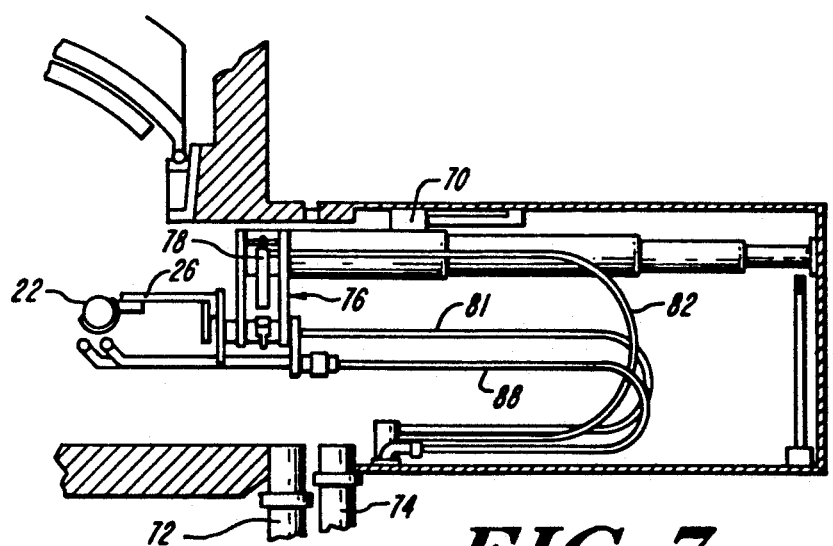
FIG. 7 is an internal side view of the vaporizer assembly of FIG. 2 in a partially retracted position.
Figure 8:
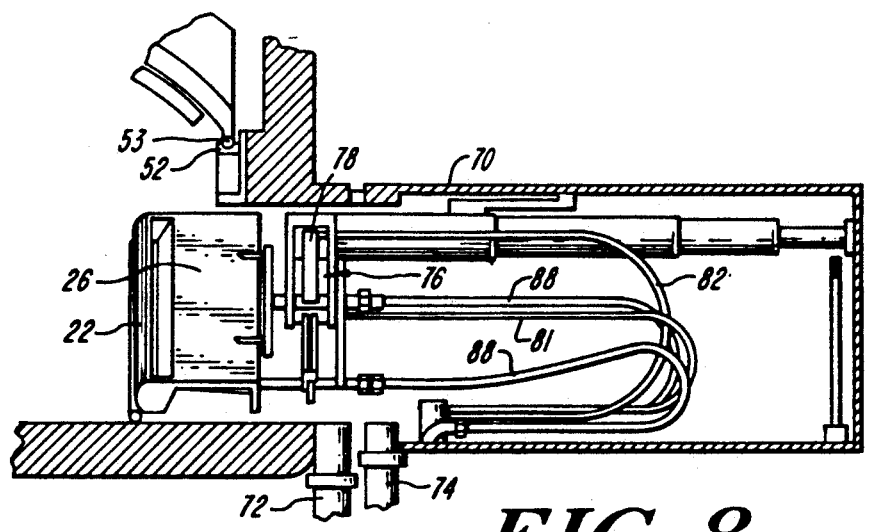
FIG. 8 is a cross-sectional side view of the vaporizer assembly of FIG. 1 in a partially retracted and rotated position.
Figure 9:
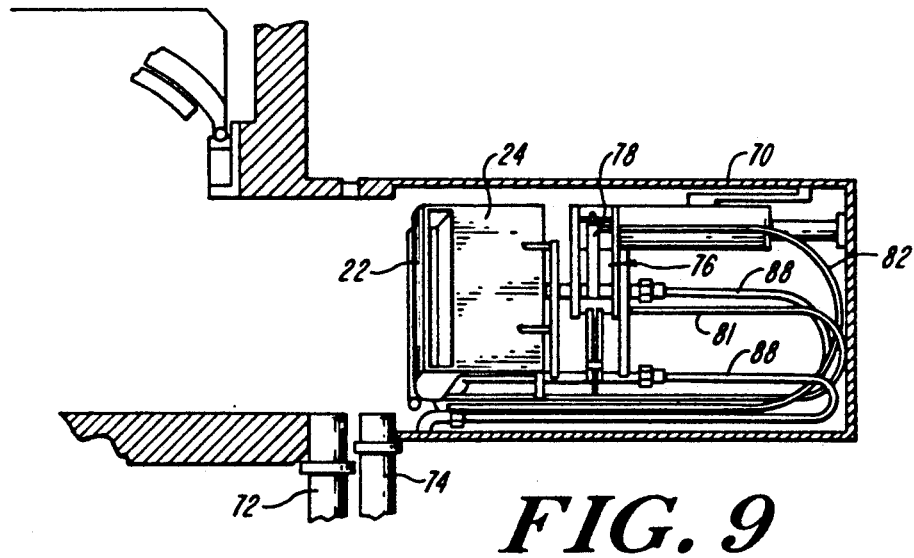
FIG. 9 is a cross-sectional side view of the vaporizer assembly of FIG. 2 in a fully retracted, rotated position.

With reference now to FIGS. 7 to 9, a preferred method for exchanging vaporizer assemblies 30 within a chamber 18 will be described. The vaporizer assembly 30 must be removed from time to time for cleaning and for the replacement of electron beam guns 24 and other elements. During removal of an assembly 30 from a module 12, only that module need be shut down, and the rest of the modules 12 may continue to function without interference or without shutdown. Furthermore, since the interior of the transfer cask 60 is also under a vacuum, the vaporizer assembly 30 may be easily replaced without loss of vacuum within any chamber 18 and without total shutdown of the module involved. The removal operation also avoids interference with the laser paths 15 below extractor assembly 40. By providing the vaporization function from cask 60 it is possible for each vaporizer assembly 30 to be tested and fully conditioned off line at a conditioning station prior to on-line start up in its selected module. Thus it is possible to make certain that all electrical, hydraulic and mechanical functions are satisfactory, thus reducing unnecessary shutdown for defective vaporizer assemblies.

Typically, crucible 22 of the vaporizer assembly is approximately a meter in its axial length within each module 12. The width of port 71 is typically several centimeters less. To overcome the problem of retracting a long crucible 22 through a shorter port 71, the crucible 22 is tilted, typically slightly over 45 degrees from the horizontal or operational position, prior to retraction through port 71. Since the uranium in crucible 22 solidifies rapidly upon shutdown of the electron beam evaporator, tilting or rotating it will not result in any evaporant spilling.

In the first step, as shown in FIG. 7, the vaporizer assembly 30 is retracted to a first position which is still within chamber 18. This retraction sequence is initiated by hydraulically actuating extensible arm 28, causing it to contract. During the same step, hydraulic mechanism 84 is actuated causing vapor and thermal shield 26 to pivot to the horizontal position covering guns 24, as shown in FIG. 7. In the next step, as shown in FIG. 8, tilting hydraulic cylinder 78 is actuated causing arm 79 vaporizer assembly 30 to pivot about a center point. As seen in FIG. 8, vapor and thermal shield 26 remains in position shown in FIG. 7, resting on the edge of crucible 22 and covering electron beam guns 24. Tilting cylinder 78 is adapted to rotate vaporizer assembly 30 until the desired angle has been reached, typically as defined by mechanical stops. Vaporizer assembly 30 is then ready to be fully retracted into vaporizer transfer cask 60. As shown in FIG. 9, arm 28 is again hydraulically actuated, completely retracting vaporizer assembly 30 into cask 60. As seen in FIG. 9, hoses 88 and hoses 82 being flexible, deploy down along bottom portion of cask 60 as the vaporizer assembly 30 is retracted therein.

In order to withdraw the extractor assembly 40, means other than rotation are necessary because of the size of the extractor assembly 40 and the interference with radiation in arch 15 rotation would create. Typically, the extractor assembly 40 is divided into two separate assemblies 40A and 40B (FIGS. 1 through 5), each being one-half the total axial dimension of the combined assembly 40. Extractor transfer cask 130 is preferably mobile and has wheels 131 which ride on rails 133. Assembly 40A is disposed on an interior end of an extendable telescoping arm 120 while assembly 40B is deposed on an interior end of extendable telescoping arm 122. Arms 120 and 122 both extend through a port 124, access through which is controlled by module 12 gate valve 126 and cask 130 gate valve 128. One valve 126 is disposed on each lateral side of each module 12, and is adapted for coupling with a transfer cask gate valve 128 disposed on a facing side of a transfer cask 130 to maintain a vacuum seal between casks 130 and chamber interiors 18 in the connected position and to maintain a vacuum in both chamber interiors 18 and casks 130 when separated. Pumping means 75' and associated conduit are provided for pumping between valves 126 and 128 before opening. Arm 120 is secured within cask 130 to beam pivot 132, while arm 122, is secured within cask 132 to beam pivot 134. Beam pivot 132 is rotatable attached to upper wall 136 of cask 130, while beam pivot 134 is mounted onto support 138 which is rotatably attached to lower wall 140 of cask 130. Arms 120 and 122 are each free to rotate horizontally and vertically about respective pivots 132 an 134, as shown in FIG. 2. Horizontal rotation thereof is accomplished by beam rotating hydraulic cylinders 142 and 144 which drive respective arms 120 and 122 about pivots 132 and 134 through respective arms 146 and 148. Arms 120 and 122 are vertically controlled by respective hydraulic cylinders 150 and 152. Cylinder 152 may have a C-configuration arm 153, as shown in FIG. 4 which permits arm 122 to be rotated into a position below arm 120 without interference between arm 153 and assembly 40A, when assemblies 40A and 40B are nested entirely within cask 130, as shown in FIG. 3. All flexible leads for coolant, hydraulics, extraction electrode power lines and instrumentation are routed through the transfer cask 130 and carried upon power track supports during extension and retraction of arms 120 and 122.

Figure 6:
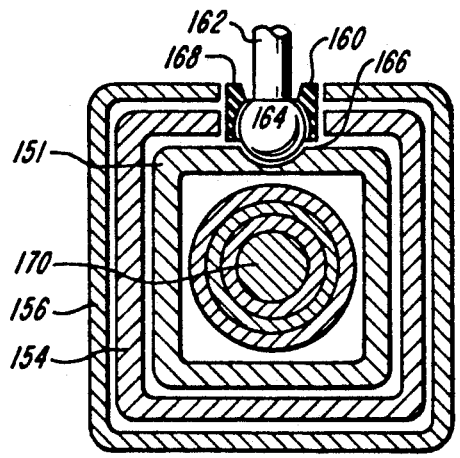
FIG. 6 is a cross-sectional view of a retracted, extensible probe taken along line 4—4 of FIG. 3.

With reference to FIG. 6, a typical structure for arms 120 and 122 is shown. Each arm 120 and 122 comprises three sections, an inner or primary beam 151, one end of which is secured to the beam pivot, an intermediate beam 154 and an outer or extension beam 156. Beams 151, 154 and 156 are preferably square or rectangular in cross-sectional shape and are substantially concentric. Beams 151, 154 and 156 are each separated along lateral faces thereof by a series of roller bearings 158 which permit beams 151, 154 and 156 to slide longitudinally with respect to one another. Beams 154 and 156 are each provided with a longitudinal slot 160 which extends along the entire length thereof, and through which an arm 162 attached to hydraulic cylinders 150 and 152 extends. Disposed o the end of arm 162 is a ball 164 which rides along a groove 166 formed in primary beam 151. Ball 164 is captured between groove 166 and primary beam 151 by means of inwardly extending shoulders 168 formed in slots 160. Arms 120 and 122 are actuated by telescoping, multi-element hydraulic cylinder 170 which extends between pivots 132, 134 and the far end of extension beam 156. Cylinder 170, as viewed in FIG. 3, is preferably disposed so that when arms 120 and 122 are retracted, it resides within primary beam 151. In operation, when arms 120 and 122 are to be retracted, hydraulic cylinder 170 is retracted, causing extension beam 156 to collapse over intermediate beam 154 and then causing intermediate beam 154 and extension beam 156 together to collapse over primary beam 151. As this happens, ball 164, affixed to beam 151, rides along groove 166 through slot 160. When arms 120 and 122 are to be extended, hydraulic cylinder 170 is extended, causing beam 156 to move to the right, in FIG. 2, and the above described process is reversed.

Extractor assemblies 40A and 40B are suspended from extension beams 156 of respective arms 120 and 122. Assemblies 40A and 40B each include an arched support structure 45 (FIG. 2), from which a cylindrical plate 43 and electrodes plates 42 are suspended. A pivot hinge 180 extends from extension beams 156 to an outer end portion of structure 45. Hinges 180 are pivotally secured both to extension beam 156 and to structure 45. A pivoted hydraulic cylinder 182 is mounted on each extension beam 156 and is attached to an inner end portion of structure 45. Cylinders 182 are hydraulically actuated to pivot assemblies 40A and 40B with respect to extension beam 156 to maintain assemblies 40A or 40B at horizontal attitude when the arms 120 and 122 are raised.

When it is desired to remove extractor assembly 40 from within chamber 18, arm 120 is raised by actuating cylinder 150 until all of assembly 40A is positioned above arm 122. Arm 122 is next raised by actuating cylinder 152 until assembly 40B is lifted from rails 44 enough to prevent blockage of region 15 during removal. The attitude of both assemblies 40A and 40B is adjusted by cylinders 182 so that structure 45 of each assembly is essentially horizontal. Then arm 120 is rotated horizontally about pivot 132 by actuating beam rotating cylinder 142 until assembly 40A is centered in the opening between valves 126 and 128. Arm 122 is also rotated in a horizontal direction about pivot 134 by actuating rotating cylinder 144, until assembly 40B is similarly centered. Finally, telescoping hydraulic cylinder 170 is actuated in both arms 120 and 122 to retract them simultaneously by collapsing extension beam 156 and intermediate beam 154 towards primary beam 153. Arms 120 and 122 are retracted until assemblies 40A and 40B are completely within transfer cask 130 and until extension beam 156 is substantially co-extensive with the primary beam 153 as is shown in FIGS. 3 and 5.

Figure 5:
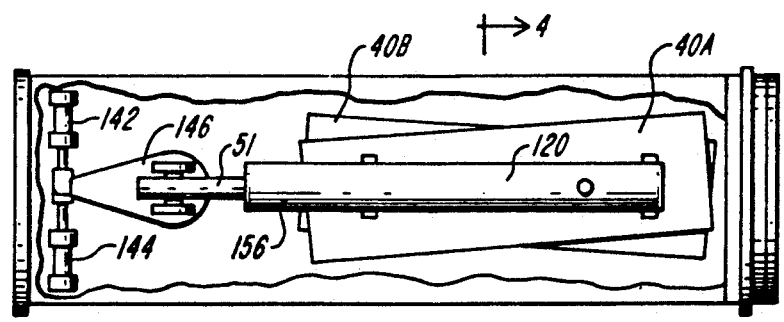
FIG. 5 is a top external view of the cask of FIG. 3 showing interior parts in phantom.

During movement of transfer cask 130 from one location to another and during coupling of transfer cask 130 with module 12 by means of transfer cask gate valve 128 and module gate valve 126, assemblies 40A and 40B are nested one above the other as shown in FIGS. 3, 4 and 5. It should be noted that beam pivots 132 and 134 are typically centered within cask 130 and pivot 132 is directly above pivot 134, as shown in FIGS. 1 and 2. Since assemblies 40A and 40B must be aligned precisely parallel to one another when positioned on rails 44, beams 156 are angularly disposed with respect to associated assemblies 40A and 40B, forming an acute angle therewith as shown in FIG. 5. Thus, when assemblies 40A and 40B are nested, and beams 156 are parallel, assembly 40A forms an acute angle with respect to assembly 40B.

The above identified process is reversed when it is desired to place a new extractor assembly 40 within a chamber 18 of a module 12. Once transfer cask 130 is in place adjacent module 12 and a seal has been established between cask gate valve 128 and module gate valve 126, the region between valve 126 and valve 128 is pumped out with pump 75', and both gates are opened, arms 120 and 122 are extended a pre-set distance into chamber 18 with assemblies 40A and 40B in a nested condition.

Arms 120 and 122 are next sequentially pivoted horizontally about respective pivots 132 and 134, and arm 120 is lowered until assemblies 40A and 40B are positioned adjacent one another, suspended in place above rails 44. Arms 120 and 122 are then lowered together until assemblies 40A and 40B are resting in Place on rails 44 V-blocks 52 may then be externally manipulated to perform the necessary precision alignment of assemblies 40A and 40B on rails 44. V-blocks 52 reduce the precision required in positioning arms 120 and 122, since arms 120 and 122 only need generally place assemblies 40A and 40B on rails 14 while V-blocks 52 perform the requisite precise positioning independently of casks 130 and probes 120 and 122. It is to be noted that this entire sequence avoids placing any obstruction in the path of laser radiation region which is below extractors 40, allowing continuous operation.

For automated operation of this sequence an hydraulic controller 135 may be provided to control hydraulic cylinders 42, 144, 150 and 152 in this prescribed sequence. Additionally, an execution source 137 is provided to electrically power extractor plates of assemblies 40A and 40B for ion extraction.

Figure 10:
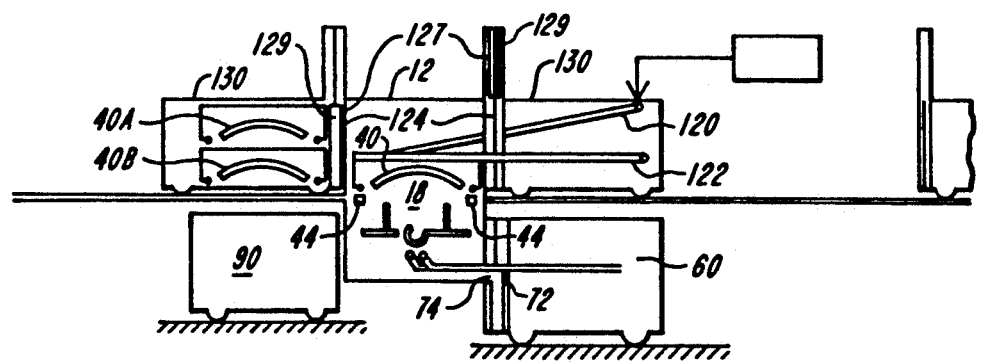
FIG. 10 is a diagrammatic, global view of the modular cask and chamber system in a fully operational condition.
Figure 11:
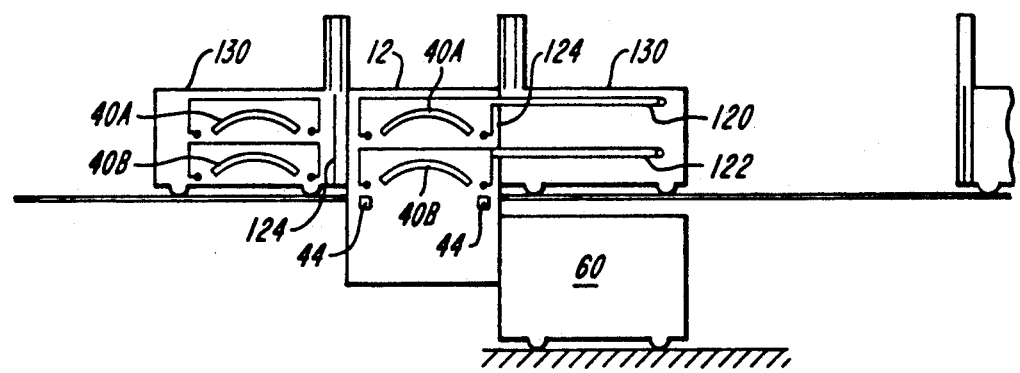
FIG. 11 is a diagrammatic global view of the modular cask and chamber system in a partial shutdown condition showing the extractor assemblies nested for retraction.

As with the vaporizer assembly, the extractor assembly must be replaced from time to time for cleaning and to recover the uranium deposited thereon. The extractor assembly also may be replaced in each individual module without shutdown of the entire process and without loss of vacuum in the affected module. A sequence for replacement of extractor assemblies without shutdown is illustrated in FIGS. 10 through 16. FIG. 10 shows a module 12 in a fully operational condition. An extractor assembly 40 is in place upon rails 44, loosely suspended from arms 120 and 122 extending from right hand cask 130 through port 124. Vaporizer transfer cask 60 is disposed directly below extractor assembly transfer cask 130, while mobile assembly 90 is disposed opposite cask 60. Another extractor assembly transfer cask 130 having an empty set of nested extractor assemblies 40A' and 40B' is ready on the left for insertion into chamber 18 of module 12. The interior of the cask 130 is in a vacuum condition, and its transfer cask gate valve 128 and the module gate valve 126 are both in a closed condition, thus effectively sealing the interior of cask 130 via gate valve plates 127 and 129 respectively. In FIG. 11, the module 12 begins undergoing extractor assembly exchange and is in a shutdown condition, and extractor assembly 40A is nested on top of extractor assembly 40B within chamber 18 and both are supported by respective arms 120 and 122 extending from the cask 130. At this point, transfer cask gate valves 128 and the module gate valves 126 of both left and right casks 130 are both in an open position. Thus, the interiors of both left and right hand transfer casks 130 are under a vacuum and are in communication with the interior of chamber 18. It should be noted that at all times the chamber gate valve 74 and transfer cask gate valve 72 of vaporizer transfer cask 60 and chamber 18 respectively remain in an open condition although vaporization is halted for FIGS. 11-13.

Figure 12:
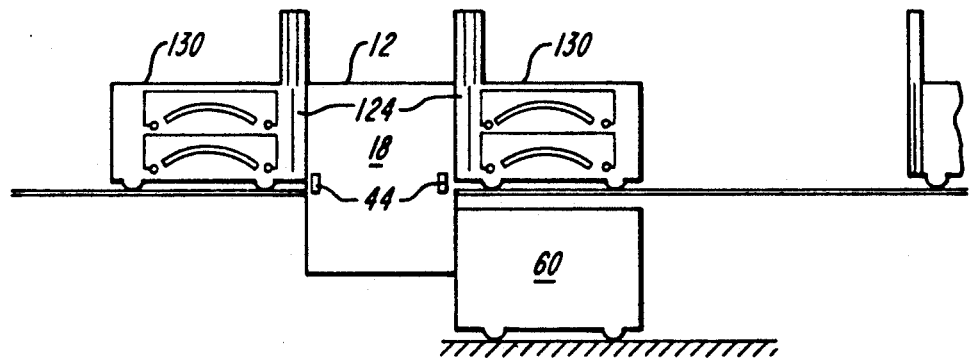
FIG. 12 is a diagrammatic, global view of the modular cask and chamber system showing the extractor assemblies in a retracted position.
Figure 13:
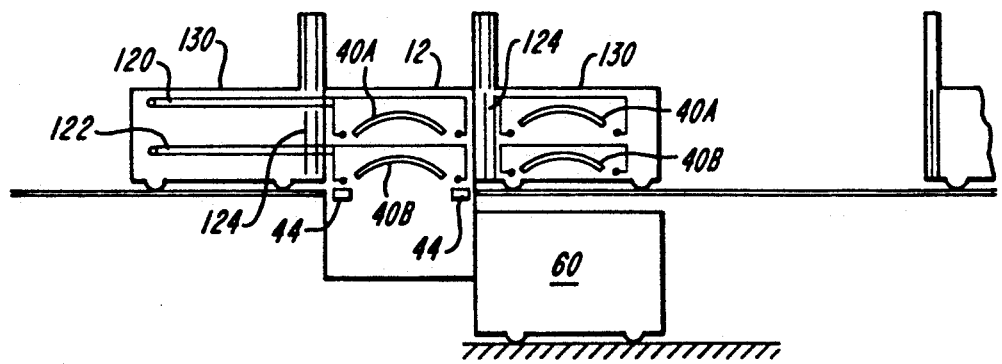
FIG. 13 is a diagrammatic and global view of the modular cask and chamber system showing a new set of extractor assemblies inserted into the unit in a nested condition.

In FIG. 12, substrate assemblies 40A and 40B have been withdrawn in a nested condition into the right hand transfer cask 130. Transfer cask gate valves 128 and module gate valves 126 on both casks 130 remain in an open position. In the next step, as shown in FIG. 13, arms 120 and 122 of the left hand cask 130 are extended so that their extractor assemblies 40A and 40B reside in a nested condition within chamber 18. All module gate valves 126 and transfer cask gate valves 128 remain open, while right hand cask 130 with nested loaded assemblies 40A and 40B remains attached to corresponding module 12.

Figure 14:
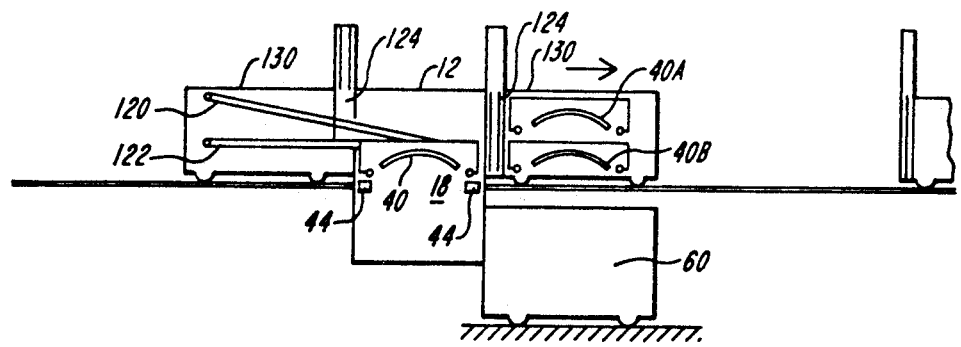
FIG. 14 is a diagrammatic, global view of the modular cask and chamber system in a start-up condition with a new set of extractor assemblies.
Figure 15:
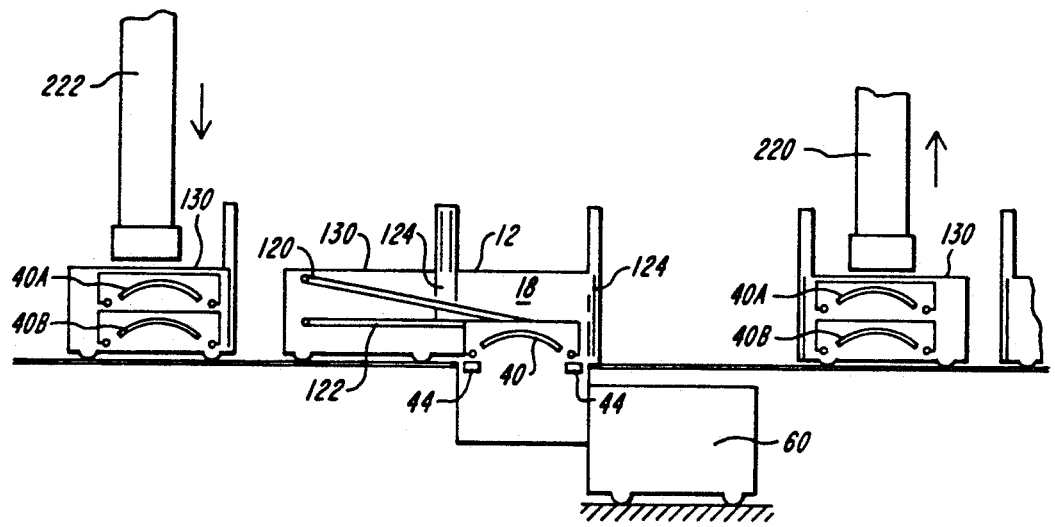
FIG. 15 is a diagrammatic, global view of the modular cask and chamber system in a completely operational condition with the just used set of extractor assemblies removed for further processing.
Figure 16:
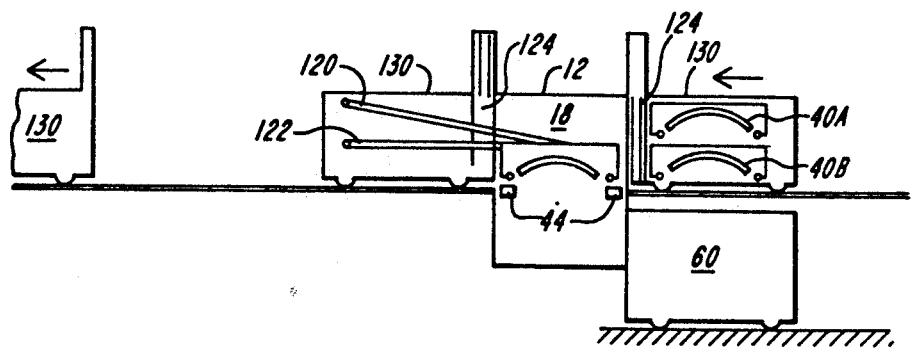
FIG. 16 is a diagrammatic, global view of the modular cask and chamber system showing another set of empty extractor assemblies ready for insertion, while the unit is in an operation condition.

In the next step, as shown in FIG. 14, extractor assemblies 40A and 40B of the left hand cask 130 are unnested and placed adjacent one another on rails 44, while module gate valve 126 and transfer cask gate valve 128 on the right side are closed. The right side transfer cask 130 remains at the module 12. The vaporizer assembly 30 is activated in preparation for full operation of the module 12. In the next step, as shown in FIG. 15, the right side transfer cask 130 is withdrawn from the module 12 to a right side overhead conveyor system 220. The module 12 is then placed in a full operating condition, which in a preferred embodiment may last for several hours. Meanwhile the overhead conveyor system 220 transports the right side transfer cask 130 with its loaded extractor assembly 40 to a disassembly station. Thereafter, a further transfer cask 130 with an empty extractor assembly 40 is placed on track 133 to the right of module 12 and is placed in vacuum lock with module 12, (FIG. 16) for later replacement of the left side 130.

To the far right the vaporizer assembly 30 or replacement assembly 90 are removed for repair or replacement as necessary at any time during the above steps when the module is in a shutdown condition, as previously described.

It should be noted that the above apparatus and method, although having particular applicability to laser isotope separation, may be applied to any process which must be conducted in a vacuum.

The above described preferred embodiment is intended as exemplary only, the scope of the actual invention being as defined in the following claims.

What is claimed is:

1. Apparatus for supporting material processing means within a predetermined atmosphere, comprising:
    an enclosure elongate in an axial direction and having at least one axially separated internal processing area said enclosure including means for containing said atmosphere in sealed separation from the environment of said enclosure;
    said at least one processing area having at least one access port;
    a plurality of mobile transfer casks, each having a material processing means stored in an interior region, and each having an access port disposed along one side thereof;
    means for coupling the access port of said casks to the access ports of said enclosure and containing said predetermine atmosphere;
    means for alternately sealing an opening the interiors of said casks to the internal processing areas of said enclosure;
    means for alternately housing, within each of said transfer casks, said material processing means and for extending said processing means form said cask into an internal processing area of said enclosure.

2. The apparatus of claim 1 wherein said housing and extending means comprise at lease one extendable arm.

3. The apparatus of claim 2 wherein each of said material processing means is disposed on an end of at least one of said arms.

4. The apparatus of claim 3 further including mounting means for receiving said processing means within said enclosure to provide a predetermined alignment of said processing means at the associated processing area.

5. The apparatus of claim 1 wherein said enclosure atmosphere is a vacuum.

6. The apparatus of claim 4 further comprising means associated with each of said transfer casks for supplying operating power to said processing means from within said casks.

7. The apparatus of claim 1 wherein said processing means is axially longer than the axial opening of said access pot.

8. The apparatus of claim 7 further comprising means associated with said housing and extending means for rotating its associated processing means to fit through said access port.

9. The apparatus of claim 7 wherein;
said processing means further includes at least tow axial separate portions of said processing means; and
said extending means includes an arm for each portion and means for controlling said arms to place said portions in a nested relationship for passing through said ports.

10. The apparatus of claims 1, 2, 3, 4, 5, 6, 7, 8, or 9 wherein said sealing an opening means includes a gate valve associated with the access ports of said cask and a gate valve associated with said enclosure and pump means for pumping down the area between said gate valves.

11. A system for selectively engaging a ported enclosure containing material processing apparatus in a predetermined environment to provide at least a portion of the processing apparatus thereto from a remote and separable unit comprising:
a cask defining a sealable interior chamber having said predetermined environment;
a cask port disposed along one side of said cask;
valve means associated with said cask port and adapted to mate with said enclosure port to form an opening between said cask and enclosure and otherwise to seal said environment within said ask to said enclosure;
means associated with said cask for extending said portion of processing apparatus through said cask and enclosure ports, for support of said portion of processing apparatus from within said cask, and for providing selective containment within said cask and within said enclosure.

12. The system of claim 11 wherein said selective containment means comprises an extendable arm.

13. The system of claim 12 wherein said portion of processing apparatus is secured to a distal end of said extendable arm.

14. The system of claim 13 wherein said extendable arm is telescoping and includes means for hydraulically extending and retracting said portion of processing apparatus to and from an operational position fully within said cask.

15. The system of claim 14 further comprising flexible means extending from said cask to said portion of apparatus for supplying coolant and electrical power thereto.

16. The system of claim 11 wherein said cask further includes means for rotating said portion of apparatus for passage through said opening.

17. The system of claim 16 wherein said portion of apparatus includes an electron beam evaporator.

18. The system of claim 17 wherein said evaporator includes a crucible containing a normally solid material.

19. The system of claim 17 further including:
a shield associated within said evaporator and;
means for tilting said shield over said evaporator for passage through said port.

20. The system of claim 11 wherein:
said portion of processing apparatus includes a plurality of sections disposed laterally adjacent one another when within said enclosure;
said supporting means includes means for vertically stacking said sections for passage through said opening and for containment within said cask.

21. The system of claim 20 wherein said supporting means includes an extendable arm for each of said sections.

22. The system of claim 21 wherein each of said sections is loosely secured to a distal end of an associated extendable arm.

23. The system of claim 21 wherein each of said extendable arms is telescoping and means are provided for hydraulically telescoping said arms to retract each section in nested relationship fully within said cask.

24. The system of claim 23 further comprising means for supplying electrical excitation to each of said sections of said modular component from within said cask.

25. The system of claim 20 wherein each of said sections includes an ion extraction system.

26. The system of claim 25 further including mounting means for each section within said enclosure to provide a predetermined alignment of said sections within said enclosures.

27. The system of claim 26 further including means for adjusting said mounting means to vary the alignment of said sections.

28. The system of claim 20 wherein the lateral dimension of said cask port is less than the lateral dimension of said sections together in the adjacent relationship within said cask.

29. A method for use in a contained processing system that includes: a vacuum enclosure elongate in a longitudinal direction and formed of a plurality of interconnected modular units aligned adjacent one another, each of said modular units having at least one access port; vacuum processing means formed of a plurality of modular sections, each of said sections being disposed in one of said modular units and having a longitudinal dimension greater tan the longitudinal dimension of said access port; and a plurality of vacuum transfer casks, each of said transfer casks being associated with one of said access ports and with one of said modular sections;
the method comprising of steps of:
retracting said section toward said associated access port a predetermined distance;
rotating said modular section about an axis generally perpendicular of the plane of its associated access port over a predetermined angle; and
withdrawing said modular unit as rotated through its associated access port and into its associated transfer cask.

30. A method for use a vacuum processing system that includes: a vacuum enclosure elongate in a longitudinal direction and formed of a plurality of interconnected modular units aligned adjacent one another, each of said modular units having at least one access port; vacuum processing means formed of a plurality of longitudinal segmented modular sections, each of said sections being disposed in one of said modular units and having a longitudinal dimension greater than the longitudinal dimension of said access port; and a plurality of vacuum transfer cass, each of said transfer casks being associated with one of said access ports and with one of said modular sections and mechanically and operationally supporting its associated modular section;

the method comprising the steps of:

nesting one segment above the other;

moving said nested segments transversely until they are centered in their nested condition in the associated access port; and retracting said segments through the associated access port in their nested condition and it the associated transfer cask.

* * * * *

UNITED STATES PATENT AND TRADEMARK OFFICE
CERTIFICATE OF CORRECTION

PATENT NO. : 5,085,410
DATED : February 4, 1992
INVENTOR(S) : Lester M. Finch

It is certified that error appears in the above-identified patent and that said Letters Patent is hereby corrected as shown below:

On the title page, item [75], "Inventor: Lester M. Ficnh," should read --Inventor: Lester M. Finch,--.

Column 7, line 54, "Disposed o the end of" should read --Disposed on the end of--.

Column 10, line 55, "sealing an opening" should read --sealing and opening--.

Column 10, line 60, "means form" should read --means from--.

Column 11, line 11, "access pot" should read --access port--.

Column 11, line 17, "at least tow" should read --at least two--.

Column 11, line 42, "said ask" should read --said cask--.

Column 12, line 48, "greater tan the" should read --greater than the--.

UNITED STATES PATENT AND TRADEMARK OFFICE
CERTIFICATE OF CORRECTION

PATENT NO.  : 5,085,410

DATED       : February 4, 1992

INVENTOR(S) : Lester M. Finch

It is certified that error appears in the above-identified patent and that said Letters Patent is hereby corrected as shown below:

Column 13, line 3, "transfer cass" should read --transfer casks--.

Signed and Sealed this

Sixth Day of July, 1993

Attest:

MICHAEL K. KIRK

Attesting Officer

Acting Commissioner of Patents and Trademarks